United States Patent
Koide

(10) Patent No.: US 7,319,283 B2
(45) Date of Patent: Jan. 15, 2008

(54) MOVING APPARATUS, EXPOSURE APPARATUS, AND DEVICE MANUFACTURING METHOD

(75) Inventor: Hiroyuki Koide, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/167,180

(22) Filed: Jun. 28, 2005

(65) Prior Publication Data

US 2005/0231141 A1 Oct. 20, 2005

Related U.S. Application Data

(62) Division of application No. 10/675,996, filed on Oct. 2, 2003, now Pat. No. 6,960,845.

(30) Foreign Application Priority Data

Oct. 8, 2002 (JP) .............................. 2002-295014

(51) Int. Cl.
H02K 41/00 (2006.01)
(52) U.S. Cl. ....................................................... 310/12
(58) Field of Classification Search .................. 310/12; 355/53, 72
See application file for complete search history.

(56) References Cited

U.S. PATENT DOCUMENTS

| 5,172,160 | A | 12/1992 | Van Eijk et al. ............... 355/53 |
|---|---|---|---|
| 5,335,044 | A | 8/1994 | Shiraishi ...................... 355/53 |
| 5,623,853 | A | 4/1997 | Novak et al. ............. 74/490.09 |
| 6,008,500 | A * | 12/1999 | Lee ............................. 250/548 |
| 6,279,490 | B1 | 8/2001 | Pastor .......................... 108/94 |
| 6,304,320 | B1 * | 10/2001 | Tanaka et al. ................. 355/73 |
| 6,316,901 | B2 * | 11/2001 | Lee ............................. 318/649 |
| 6,396,568 | B1 | 5/2002 | Nishi ........................... 355/71 |
| 6,449,030 | B1 | 9/2002 | Kwan ........................... 355/72 |
| 6,504,162 | B1 * | 1/2003 | Binnard et al. ........... 250/492.2 |
| 6,525,803 | B2 | 2/2003 | Kwan et al. ................... 355/53 |
| 6,717,653 | B2 | 4/2004 | Iwamoto et al. ............... 355/72 |

FOREIGN PATENT DOCUMENTS

| EP | 0 502 578 A1 | 9/1992 |
|---|---|---|
| JP | 5-121294 | 5/1993 |
| JP | 10-311364 | 11/1998 |
| JP | 2000-77332 | 3/2000 |
| JP | 2002-008971 | 1/2002 |

OTHER PUBLICATIONS

T. Bruner, Pushing the limits of lithography for IC production, 1977 IEEE, pp. 1.2.1 and 1.2.4.*
Japanese Office Action dated Feb. 5, 2007, Issued in corresponding Japanese patent application No. 2002-295014, with English translation.

* cited by examiner

*Primary Examiner*—Dang Le
*Assistant Examiner*—Nguyen Hanh
(74) *Attorney, Agent, or Firm*—Fitzpatrick, Cella, Harper & Scinto

(57) ABSTRACT

A moving apparatus includes a first actuator having a movable element and a stator, and a second actuator for driving the stator. The second actuator drives the stator in a direction to suppress rotation of the stator which accompanies movement of the movable element.

4 Claims, 9 Drawing Sheets

MOVING APPARATUS, EXPOSURE APPARATUS, AND DEVICE MANUFACTURING METHOD

This application is a divisional application of U.S. patent application Ser. No. 10/675,996, filed Oct. 2, 2003 now U.S. Pat. No. 6,960,845.

FIELD OF THE INVENTION

The present invention relates to a moving apparatus, an exposure apparatus, and a device manufacturing method.

BACKGROUND OF THE INVENTION

In recent years, demand has arisen for higher-accuracy control for a moving apparatus which moves with an object such as a structure placed on its stage. For example, with an exposure apparatus used for the manufacture of semiconductor devices or the like, as the integration density of the semiconductor devices increases, a higher-accuracy micro-patterning technique is demanded. In order to realize this, a moving apparatus such as a wafer stage must be controlled at high accuracy.

Typical examples of an exposure apparatus used for the manufacture of semiconductor devices include a step-and-repeat exposure apparatus (to be referred to as a "stepper" hereinafter) and a step-and-scan exposure apparatus (to be referred to as a "scanner" hereinafter).

A stepper is an exposure apparatus that sequentially exposes the pattern of a master (e.g., a reticle, mask, or the like) onto a plurality of exposure regions on a substrate (e.g., a wafer, glass substrate, or the like), used for manufacturing semiconductor devices, through a projection optical system while stepping the substrate.

A scanner is an exposure apparatus that repeats exposure and transfer onto the plurality of regions on the substrate by repeating stepping and scanning exposure. The scanner limits exposure light with a slit, so that it uses that portion of a projection optical system which is relatively close to the optical axis. For this reason, generally, the scanner can expose a fine pattern with a wider angle of view at higher accuracy than with the stepper.

Such an exposure apparatus has a stage (e.g., a wafer stage, reticle stage, or the like) for moving a wafer or reticle at a high speed. When the stage is driven, a reaction force of an inertial force accompanying acceleration and deceleration of the stage occurs. When the reaction force is transmitted to the stage surface plate, the stage surface plate swings or vibrates. Consequently, characteristic vibration is excited in the mechanical system of the exposure apparatus to generate high-frequency vibration. This vibration interferes with high-accuracy control for the moving apparatus.

To decrease the vibration of the apparatus caused by the reaction force, a moving apparatus as shown in FIG. 6 is proposed. As shown in FIG. 6, a conventional moving apparatus has a stage 51 and a movable body (to be referred to as a "counter" hereinafter) 52 for canceling the reaction force. The stage 51 and counter 52 are driven by feedback control controlling a position in the Y direction, and a target value is given such that the ratio of the moving distance of the stage 51 in the Y direction to that of the counter 52 in the Y direction is substantially constant. This improves the canceling efficiency for the reaction force of the stage 51.

With the conventional moving apparatus, however, as shown in FIG. 6, it is difficult to overlay the power point in the X direction of the stage 51 and the barycenter in the X direction of the counter 52 completely. Hence, due to the displacement in the X direction of the power point of the stage 51 and the barycenter of the counter 52, when the stage 51 moves in the Y direction, a moment is produced in the counter 52, and the counter 52 rotates. Therefore, with the conventional moving apparatus, it is difficult to control positioning of the stage at high accuracy.

SUMMARY OF THE INVENTION

The present invention has been made in view of the above problem, and has as its object to control, e.g., positioning of a stage at high accuracy.

The first aspect of the present invention relates to a moving apparatus, characterized by comprising a first actuator having a movable element and a stator, a second actuator which drives the stator, wherein the second actuator drives the stator in a direction to suppress rotation of the stator which accompanies movement of the movable element. The second actuator comprises an actuator which drives the stator in the Y direction and an actuator which drives the stator in the X and θ direction.

A preferred embodiment of the present invention preferably comprises a feed forward compensator which controls the second actuator on the basis of a signal supplied to the first actuator or a physical quantity of the movable element.

A preferred embodiment of the present invention further preferably comprises a compensator which controls the second actuator on the basis of an acceleration of the movable element.

According to a preferred embodiment of the present invention, a target acceleration is preferably used as the acceleration of the movable element.

According to a preferred embodiment of the present invention, an actual acceleration measured by a measurement unit is preferably used as the acceleration of the movable element.

According to a preferred embodiment of the present invention, the signal preferably includes a manipulated variable with which the first actuator is operated.

According to a preferred embodiment of the present invention, a gain of the compensator is preferably determined in accordance with a distance between a power point of the movable element in a predetermined direction and a barycenter of the stator when the movable element is driven by the first actuator.

According to a preferred embodiment of the present invention, the stator preferably absorbs a reaction force that acts on the stator when the movable element is driven by the first actuator.

A second aspect of the present invention relates to an exposure apparatus, characterized by comprising an optical system which projects exposure light, to be irradiated to a master having a pattern, onto a substrate, a stage which can move while holding the substrate or the master, a first actuator having a movable element and a stator, the movable element being connected to the stage, a second actuator which drives the stator in the Y direction, and a third actuator which drives the stator in the X and θ direction, wherein the third actuator drives the stator in a direction to suppress rotation of the stator which accompanies movement of the movable element.

A third aspect of the present invention relates to a semiconductor device manufacturing method, characterized by comprising an applying step of applying a photosensitive material on a substrate, an exposure step of transferring a pattern onto the substrate, applied with the photosensitive material in the applying step, by utilizing the above exposure apparatus, and a developing step of developing the photosensitive material on the substrate where the pattern has been transferred in the exposure step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 1A:
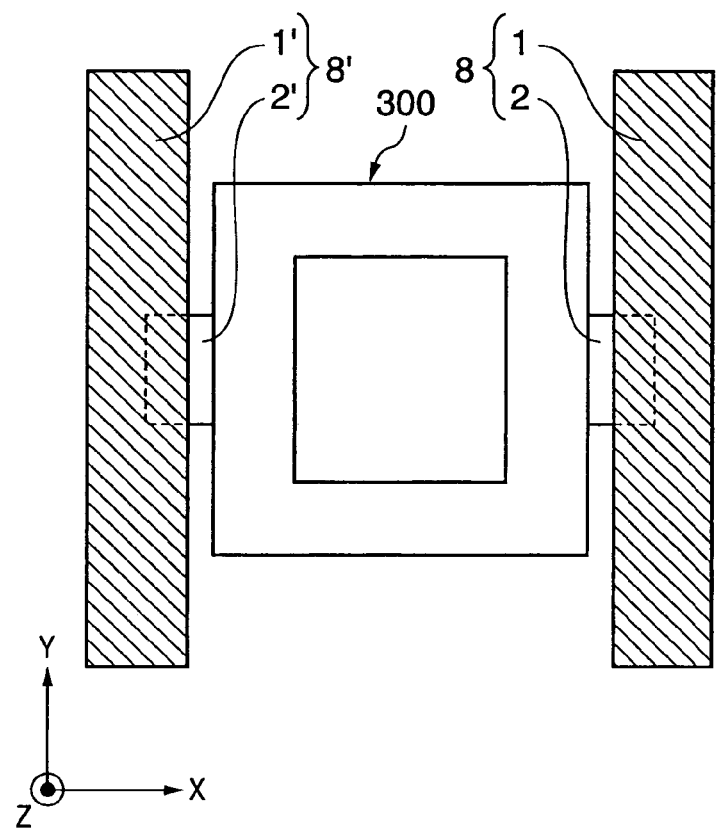
FIGS. 1A and 1B are views showing a moving apparatus according to the first embodiment of the present invention.

The preferred embodiments of the present invention will be described in detail with reference to the accompanying drawings. The same constituent elements in the drawings are denoted by the same reference numerals.

First Embodiment

A moving apparatus as the first preferred embodiment of the present invention will be described with reference to the drawings.

Figure 1B:
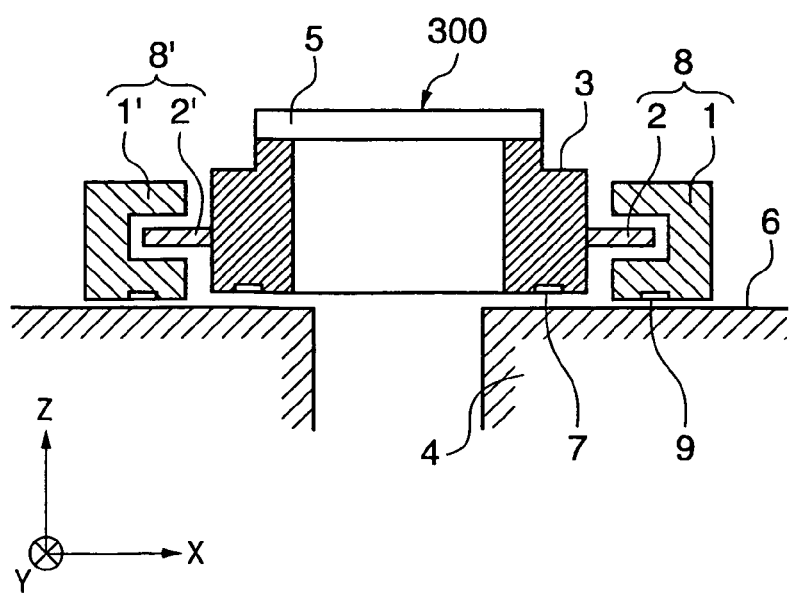

FIG. 1A is a plan view showing the arrangement of the moving apparatus according to a preferred embodiment of the present invention, and FIG. 1B is a sectional view of the same. As shown in FIG. 1B, a flat guide surface 6 as the reference surface of the moving apparatus is formed on a reference structure 4. A movable portion 3 is supported above the flat guide surface 6 in a non-contact manner by static pressure bearings 7. As shown in FIG. 1A, the movable portion 3 can move in the Y direction along the flat guide surface 6. Electromagnetic actuators 8 and 8' for moving the movable portion 3 in the Y direction are provided on the two sides of the movable portion 3, as shown in FIG. 1B. The movable portion 3 is driven by the two sets of electromagnetic actuators 8 and 8'. The electromagnetic actuators 8 and 8' include movable elements 2 and 2' connected to the movable portion 3 which moves along the flat guide surface 6, and stators 1 and 1'. For example, a top plate 5 is formed on the movable portion 3. A moving target object (e.g., a wafer or the like) can be placed on the top plate 5.

The stators 1 and 1' are supported above the flat guide surface 6 in a non-contact manner by static pressure bearings 9, and can move in the Y direction. The stators 1 and 1' have predetermined masses, and can absorb a reaction force generated by acceleration and deceleration of the movable portion 3. The stators 1 and 1' can be formed of permanent magnets, and the movable elements 2 and 2' can be formed of coils. Conversely, the stators 1 and 1' may be formed of coils, and the movable elements 2 and 2' may be formed of permanent magnets.

One or a plurality of interferometers (not shown) is provided to control the moving apparatus, and can position the movable elements 2 and 2' or movable portion 3 with reference to the reference structure 4. Similarly, an interferometer (not shown) for measuring the positions of the stators 1 and 1' is provided to position the stators 1 and 1' which move within a plane. In the above manner, a movable body 300 serving as a stage having the movable portion 3 (including the top plate 5 provided on it) and the movable elements 2 and 2' can move in the Y direction in a non-contact manner with the flat guide surface 6.

When the movable body 300 moves, the stators 1 and 1' receive the reaction force of a force acting on the movable body 300. Upon reception of the reaction force, the stators 1 and 1' can move along the flat guide surface 6. More specifically, the stators 1 and 1' serve to absorb the reaction force accompanying the driving operation of the movable body 300 by moving along the flat guide surface 6. For example, when the movable body 300 including the movable portion 3 and the like is driven in the +Y direction, the stators 1 and 1' receive the reaction force in the −Y direction and move in the −Y direction, so that they can absorb the reaction force.

As described above, the reaction force during acceleration and deceleration which acts on the movable body 300 when it moves can be absorbed by the stators 1 and 1'. The reaction force is converted into kinetic energy when the stators 1 and 1' (reaction force movable portion), which have received the reaction force, move. Although two stators are provided in this case, the present invention is not limited to this. The number of stators may be one, or three or more.

With the above arrangement, the force acting on the movable body 300 and its reaction force are limited on the flat guide surface 6 of the reference structure 4. Hence, the reference structure 4 can be prevented from vibrating due to the driving force acting on the movable body 300 and the reaction force acting on the stators 1 and 1'. Furthermore, according to this embodiment, vibration can be prevented from transmitting to the floor of the area where the moving apparatus is installed, or to other apparatuses.

When the masses of the stators 1 and 1' are increased to be sufficiently larger than the mass of the movable body 300 including the movable portion 3, and the like, the movable range of the stators 1 and 1' can be limited to be small. This enables downsizing of the apparatus, and reduces the floor area of the semiconductor factory, thus contributing to the reduction of the construction cost of the entire semiconductor factory.

Figure 2:
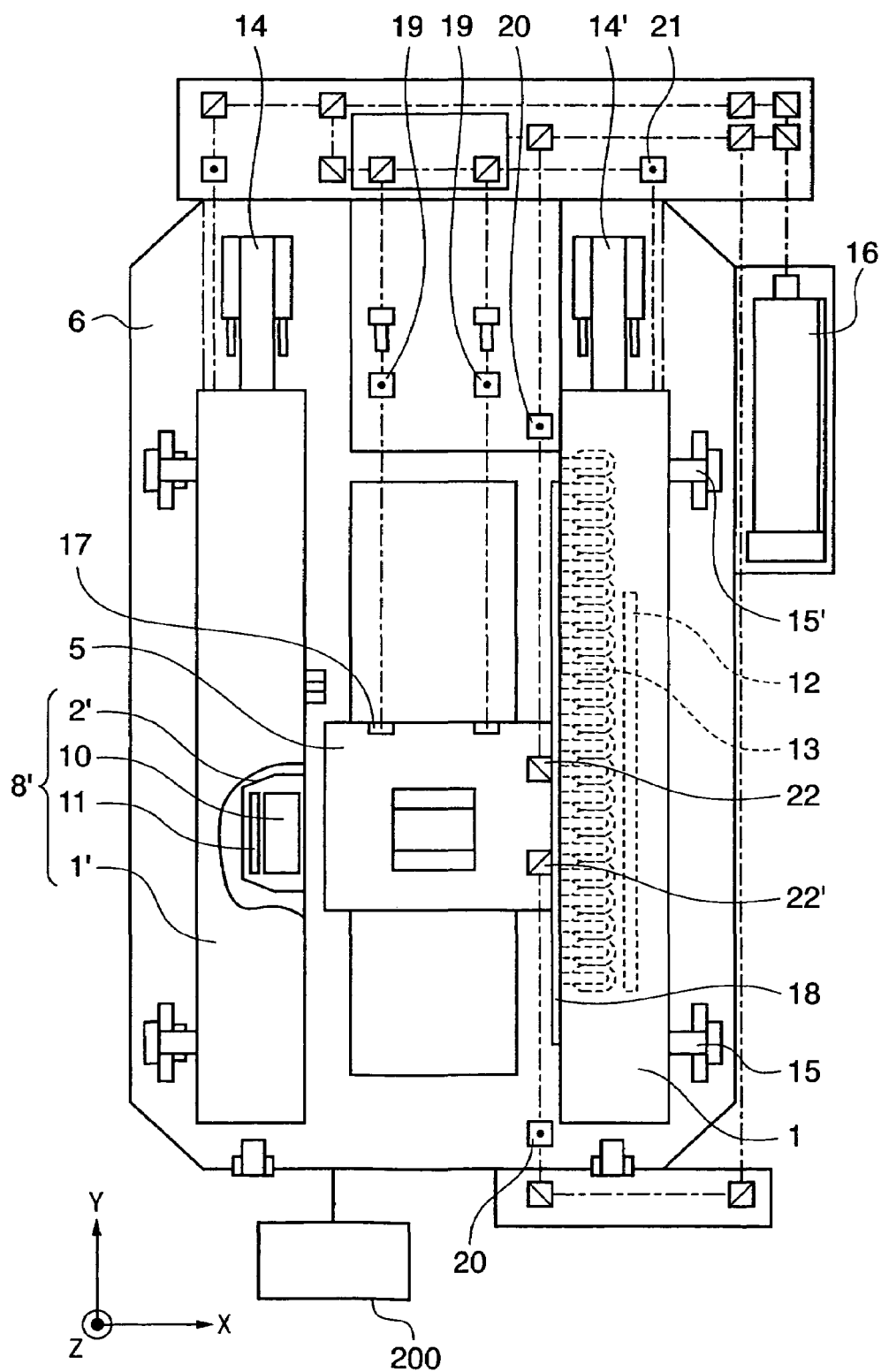
FIG. 2 is a view showing in detail the moving apparatus according to the first embodiment of the present invention.

A more practical arrangement of the moving apparatus according to the first preferred embodiment of the present invention will be described. FIG. 2 shows the more practical arrangement of the moving apparatus according to the preferred embodiment of the present invention. As shown in FIG. 2, the flat guide surface 6 as the reference surface of the moving apparatus is formed on the reference structure 4. The movable portion 3 (see FIG. 1B) provided under the top plate (X-Y stage) 5 is supported on the flat guide surface 6 in a non-contact manner through the static pressure bearings 7, and can move in an X-Y direction. The electromagnetic actuators 8 (not shown) and 8' for driving the movable portion 3 with a long stroke in the Y direction and with a short stroke in the X direction are provided on the two sides of the movable portion 3. The electromagnetic actuators 8 and 8' include the movable elements 2 and 2' and stators 1 and 1' which are separate from and independent of each other on the right and left sides (see FIGS. 1A and 1B). Two, right and left movable-portion Y magnets 10 and two, right and left movable-portion X magnets 11 are attached to the right and left movable elements 2 and 2'. The stators 1 and 1' are supported on the flat guide surface 6 in a non-contact manner through the static pressure bearings 8 (see FIG. 1B), and can move in the X-Y direction (planar directions). The stators 1 and 1' have predetermined masses, and can absorb the reaction force, generated by acceleration and deceleration of the movable body 300 including the movable portion 3 and movable elements 2 and 2', by moving on the flat guide surface 6. X-axis linear motor single-phase coils 12 and Y-axis linear motor multiphase coils 13 having an array of a plurality of coils in the Y direction are arranged in the stators 1 and 1', and are switched to achieve movement in the X and Y axes.

The position of the top plate (X-Y stage) 5 is measured by a laser interferometer formed of a laser head 16, a Y-axis measurement mirror 17, an X-axis measurement bar mirror 18, left and right two Y-axis measurement detectors 19, front and rear two X-axis measurement detectors 20, and the like. More specifically, optical elements 22 and 22' loaded on the top plate 5 are irradiated with laser beams in the Y direction. The measurement beams are reflected or polarized in the X-axis direction to irradiate the X-axis measurement bar mirror 18, and are measured by the X-axis measurement detector 20, so that the position in the X-axis direction of the top plate 5 is measured. The position in the Y-axis direction of the top plate 5 is measured in the following manner. The Y-axis measurement mirror 17 is irradiated with a laser beam in the Y direction, and the laser beam is measured by the Y-axis measurement detector 19. The positions in the Y-axis direction of the stators 1 and 1' are measured by two, right and left stator Y-axis measurement detectors 21.

The movable portion 3 in which the substrate (wafer) is placed on the top plate (X-Y stage) 5 is moved in the X-Y direction by the electromagnetic actuators 8 and 8' constituted by the movable elements 2 and 2' and stators 1 and 1'. The stators 1 and 1' receive the reaction force of the force acting on the movable body 300 including the movable portion 3 and movable elements 2 and 2'. The stators 1 and 1' move on the flat guide surface 6 by the reaction force. The stators 1 and 1' can absorb the reaction force by moving on the flat guide surface 6. In this embodiment, when the movable body 300 including the movable portion 3 moves in the +Y direction, the stators 1 and 1' receive the reaction force in the −Y direction and move in the −Y direction.

Furthermore, according to this embodiment, as the actuators for driving the stators 1 and 1' in the Y-axis direction, two, right and left Y-axis position control linear motors 14 and 14' are provided to the reference structure 4. Similarly, four, left, right, front, and rear X-axis position control linear motors 15 and 15' for driving the stators 1 and 1' in the X-axis direction are provided to the reference structure 4.

A total of four, front and rear X-direction position measurement units (not shown) are provided, two on the left side of the support line of the X-axis position control linear motor 15 and two on the right side of the support line of the X-axis position control linear motor 15', so that the positions in the X direction of the stators 1 and 1' can be measured.

A process of the moving apparatus according to the first preferred embodiment of the present invention will be described.

Figure 3:
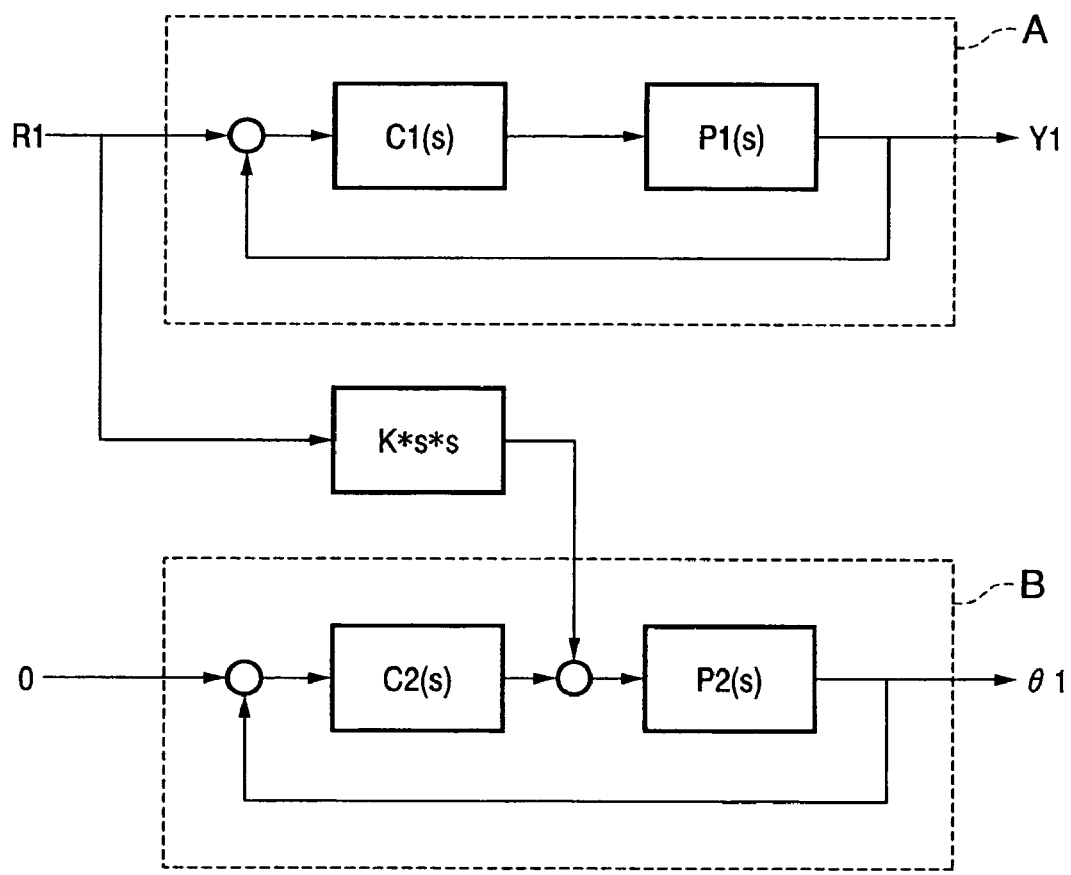
FIG. 3 is a control block diagram according to the first embodiment of the present invention.

FIG. 3 is a control block diagram of the moving apparatus according to the first preferred embodiment of the present invention. A feedback control system A is a feedback control system for the movable elements 2 and 2', and a feedback control system B is a feedback control system for the stators 1 and 1'. The target value R1 of the feedback control system A is fed forward to the feedback control system B via a derivative element (K*s*s).

As shown in FIG. 1B, a case will be described wherein the movable portion 3 having the top plate 5 is to be driven in the Y direction by the electromagnetic actuators 8 and 8' having the movable elements 2 and 2' connected to the movable portion 3 and stators 1 and 1'. The movable portion 3 is positioned when the electromagnetic actuators 8 and 8' including the movable elements 2 and 2' and stators 1 and 1' are feedback-controlled on the basis of the position information of the movable portion 3 measured by the Y-axis measurement detectors 19. Reference numeral P1($s$) denotes the dynamic characteristics of the electromagnetic actuators 8 and 8' including the movable elements 2 and 2' and stators 1 and 1'. An output from P1($s$) indicates the measurement position, i.e., a position Y1 of the movable portion 3 measured by the Y-axis measurement detectors 19. A compensator C1($s$) provides a manipulated variable to P1($s$), i.e., the electromagnetic actuators 8 and 8' on the basis of the deviation between target value R1 and controlled variable Y1.

As described above, the movable portion 3 can be driven to a predetermined position by causing the controlled variable (position controlled variable) Y1 of the movable portion 3 to follow a target value (position target value) R1 with the feedback control system A of the movable portion 3.

The moving apparatus according to the first preferred embodiment of the present invention has the feedback control system B for controlling the rotation amount on the X-Y plane of the stators 1 and 1', so that the stators 1 and 1' are kept horizontal to the movable direction (Y direction) of the movable portion 3. Referring to FIG. 3, reference numeral P2($s$) denotes the dynamic characteristics of electromagnetic actuators having the linear motors 15 and 15' and right and left stators 1 and 1' for driving the stators 1 and 1'. An output from P2($s$) indicates the measurement position, i.e., a rotation amount θ1 of the stator elements 1 and 1'. The rotation amount θ1 is calculated by the two X-direction position measurement units (not shown) attached to each of the stators 1 and 1'. A compensator C2($s$) is arranged as an input stage with respect to the stators 1 and 1' serving as the control target. A compensator C2($s$) provides a manipulated variable to P2($s$), i.e., the electromagnetic actuators for driving the stators 1 and 1' on the basis of the deviation between target value 0 and the rotation amount θ1.

With the above arrangement, in the feedback control system B for the stators 1 and 1', the target value is set to 0, so that the rotation amount of the stators 1 and 1' can be kept at 0.

According to this embodiment, as shown in FIG. 3, the derivative element (K*s*s) differentiates the target value R1 for controlling the movable elements 2 and 2' and feeds forward the target acceleration calculated from the target value to the feedback control system B which controls the rotation amount of the stators 1 and 1'. Reference symbol K denotes the feed forward gain of a signal to be supplied to the electromagnetic actuators of the feedback control system B. According to this embodiment, a manipulated variable to P2($s$), i.e., the electromagnetic actuators for driving the stators 1 and 1' is generated by combining the target acceleration calculated by the derivative element (K*$s$*$s$) and the output from the compensator C2($s$). Hence, in the feedback control system B, the electromagnetic actuators for driving the stators 1 and 1' can be controlled to suppress the rotation of the stators 1 and 1' by applying the target acceleration calculated by the derivative element (K*$s$*$s$) to the manipulated variable in advance. The stators 1 and 1' can be driven in the direction to suppress their rotation that accompanies the movement of the movable elements 2 and 2'. As a result, rotation of the stators 1 and 1', which occurs when accelerating the movable elements 2 and 2' and movable portion 3, is suppressed, so that the stage can be positioned at high accuracy.

Second Embodiment

Figure 4:
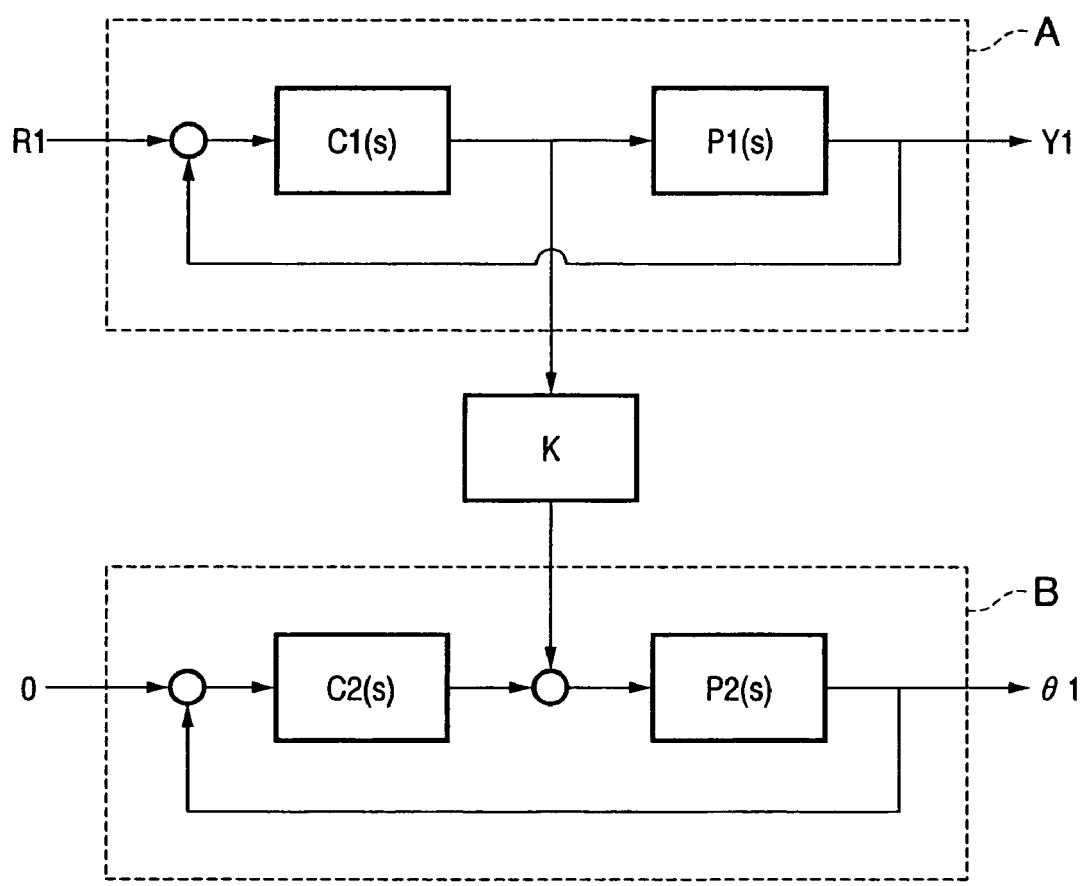
FIG. 4 is a control block diagram according to the second embodiment of the present invention.

FIG. 4 is a control block diagram of a moving apparatus according to the second preferred embodiment of the present invention. In this embodiment, the output from the compensator C1($s$) is fed forward to the feedback control system B via a proportional element (K). As shown in FIG. 4, a manipulated variable for manipulating the electromagnetic actuators 8 and 8' of a feedback control system A is increased by a factor of N and is fed forward to a feedback control system B which controls the rotation amount of stators 1 and 1'. Similarly to the first embodiment, reference symbol K denotes the feed forward gain of a signal to be supplied to the electromagnetic actuators of the feedback control system B. According to this embodiment, a manipulated variable to P2($s$), i.e., the electromagnetic actuators for driving the stators 1 and 1' is generated by combining the output from the compensator C1($s$) being increased by a proportional element (K) by a factor of N and the output from the compensator C2($s$). Hence, in the feedback control system B, the electromagnetic actuators for driving the stators 1 and 1' can be controlled to suppress the rotation of the stators 1 and 1' by applying the output from the compensator C1($s$) being increased by a proportional element (K) by a factor of N to the manipulated variable in advance.

Third Embodiment

Figure 5:
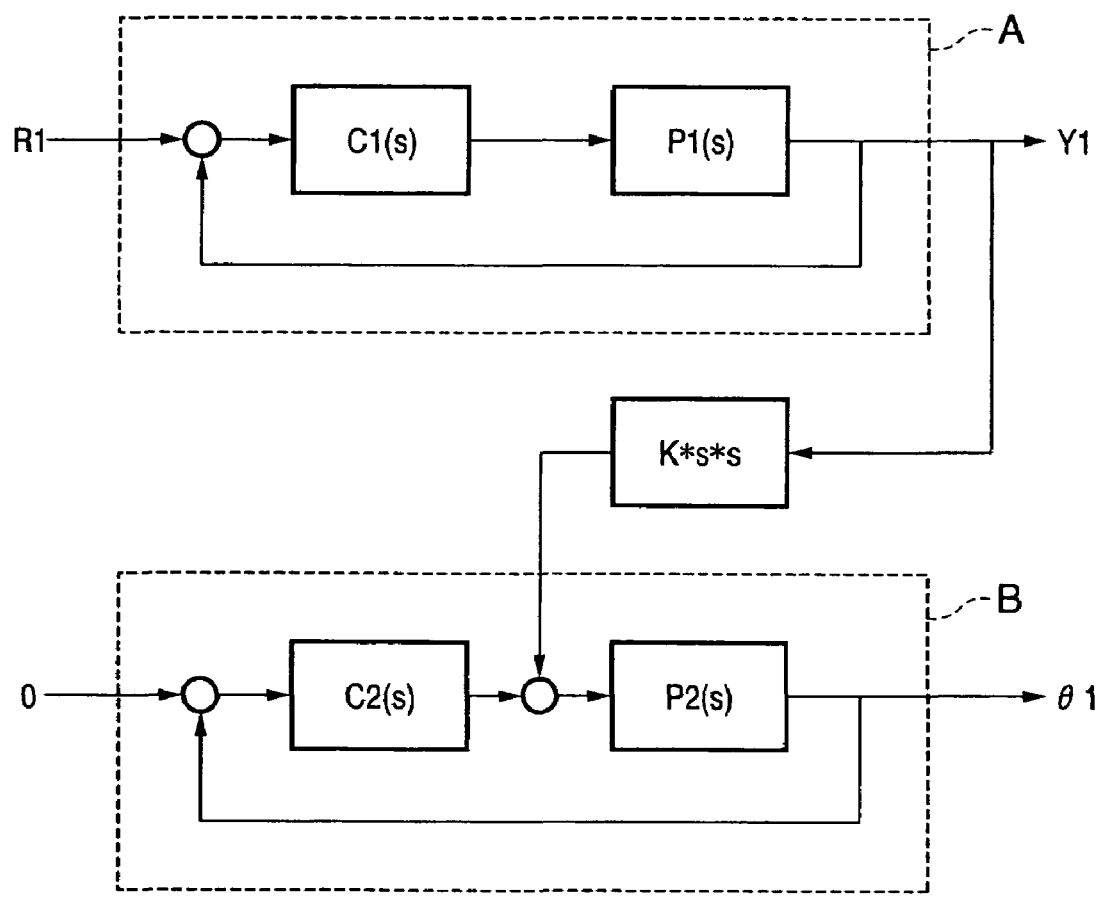
FIG. 5 is a control block diagram according to the third embodiment of the present invention.
Figure 6:
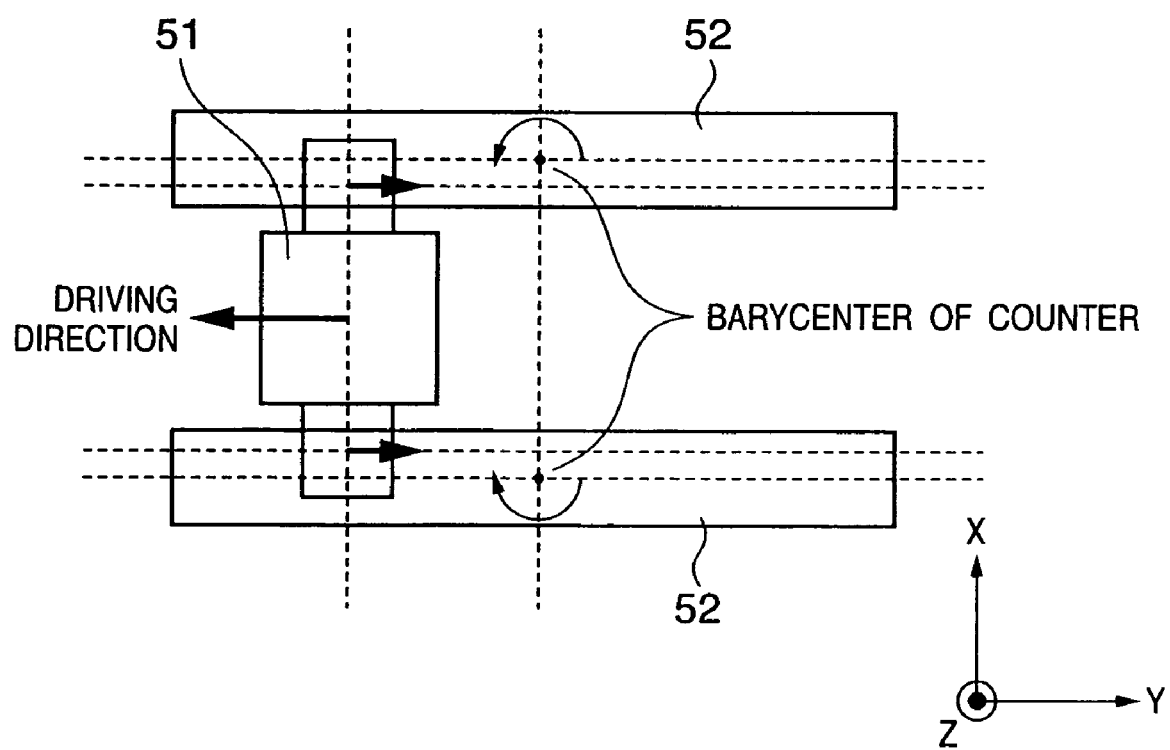
FIG. 6 is a view showing a conventional moving apparatus.

FIG. 5 is a block diagram of a moving apparatus according to the third preferred embodiment of the present invention. In this embodiment, the controlled value (position information) of the feedback control system A is fed forward to the feedback control system B via a derivative element (K*$s$*$s$). As shown in FIG. 5, the derivative element (K*$s$*$s$) differentiates the position information Y1 of movable elements 2 and 2' measured by Y-axis measurement detectors 19, a feedback control system A feeds forward the acceleration (actual acceleration) of the movable elements 2 and 2' calculated from the position information to a feedback control system B which controls the rotation amount of stators 1 and 1'. In the same manner as in the first and second embodiments, reference symbol K denotes the feed forward gain of a signal to be supplied to the electromagnetic actuators of the feedback control system B. According to this embodiment, a manipulated variable to P2($s$), i.e., the electromagnetic actuators for driving the stators 1 and 1' is generated by combining the actual acceleration calculated by the derivative element (K*$s$*$s$) and the output from the compensator C2($s$). Hence, in the feedback control system B, the electromagnetic actuators for driving the stators 1 and 1' can be controlled to suppress the rotation of the stators 1 and 1' by applying the target acceleration calculated by the derivative element (K*$s$*$s$) to the manipulated variable in advance. An acceleration meter may be provided in place of the Y-axis measurement detectors 19.

Other Embodiment

A moving apparatus according to a preferred embodiment of the present invention is formed such that its movable portion 3 is movable in the X direction and the power point in the X direction of the movable portion 3 with respect to counter masses (stators) 1 and 1' changes in accordance with the position in the X direction of the movable portion 3. In this case, the moving apparatus can be formed such that the gain (feed forward gain) of a signal to be supplied to the electromagnetic actuators of a feedback control system B changes in accordance with the distance between the power points of movable elements 2 and 2' during driving in the X direction and the barycenters of the stators 1 and 1'. This enables higher-accuracy positioning control.

As described above, according to the preferred embodiment of the present invention, when the signal used in the control system for the movable portion is fed forward to a control system for the stators, swing, rotation and the like, of the stators which occur due to acceleration of the movable elements, can be suppressed.

Figure 7:
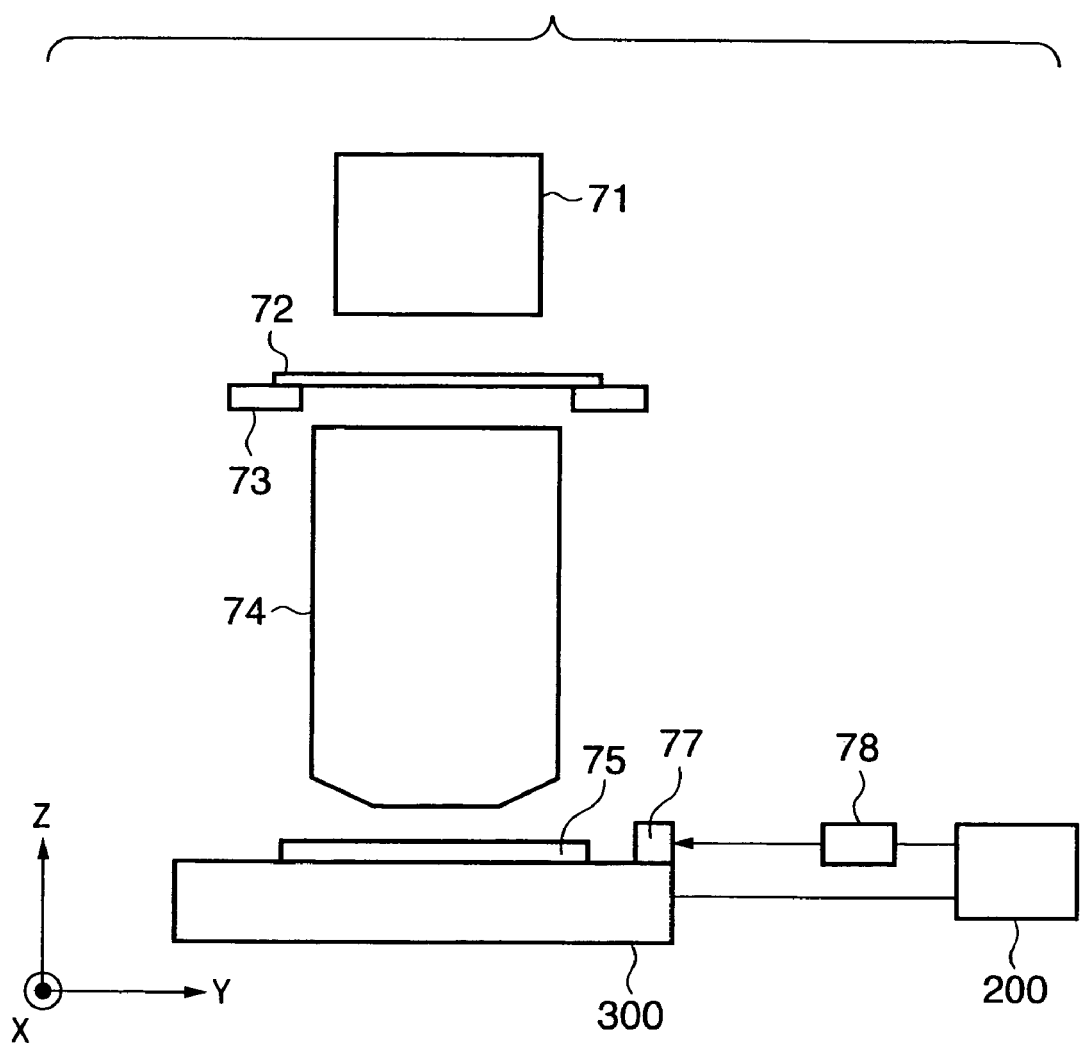
FIG. 7 is a conceptual view of an exposure apparatus to which a moving apparatus according to a preferred embodiment of the present invention is applied.

FIG. 7 is a conceptual view of an exposure apparatus which is used when the moving apparatus according to any preferred embodiment of the present invention is applied to a semiconductor device manufacturing process. Referring to FIG. 7, a reticle 72 serving as a master is irradiated with light emerging from an illumination optical system 71. The reticle 72 is held on a reticle stage 73, and its pattern is reduced and projected with the magnification of a reduction projection lens 74 to form a reticle pattern image on the image surface of the reduction projection lens 74. The image surface of the reduction projection lens 74 is perpendicular to the Z direction. A resist is applied to the surface of a substrate 75 as an exposure target sample, and shots formed in an exposure process are arrayed on the resist. The substrate 75 is placed on a stage 300 including a movable body and the like. The stage 300 is formed of a chuck for fixing the substrate 75, an X-Y stage horizontally movable in X- and Y-axis directions, and the like. The position information of the stage 300 is constantly measured by a stage interferometer 78 with respect to a mirror 77 fixed to the stage 300. The moving apparatus according to the embodiment of the present invention generates a control signal from a position signal output from the stage interferometer 78 and the like, and controls the position of the stage 300.

The exposure apparatus may perform scanning and exposure of transferring a predetermined region of the pattern of a master onto a substrate by moving and scanning both the master and substrate with respect to an optical system. In this case, the exposure apparatus can drive at least one of the master and substrate during scanning by means of a stage provided to the moving apparatus according to any preferred embodiment of the present invention. Ultraviolet rays may be used as the exposure light. In this case, as the ultraviolet rays, for example, a laser beam from a fluorine excimer laser, an ArF excimer laser, or the like, which uses a laser as the light source, is preferably used.

Figure 8:
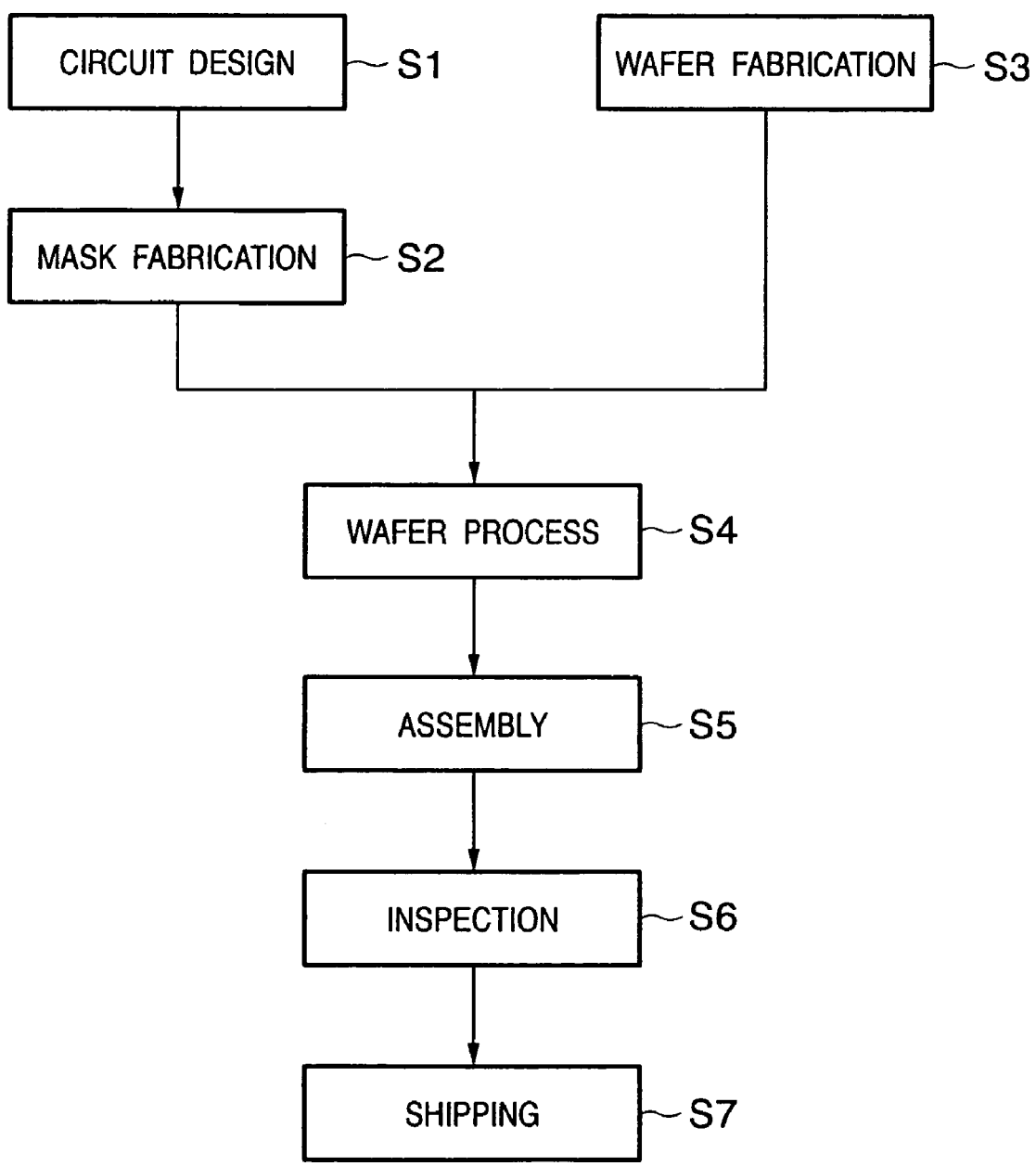
FIG. 8 is a flow chart showing the flow of an overall semiconductor device manufacturing process.

A semiconductor device manufacturing process utilizing the above exposure apparatus will be described. FIG. 8 is a flow chart of the flow of the overall semiconductor device manufacturing process. In step 1 (circuit design), circuit design of a semiconductor device is performed. In step 2 (mask fabrication), a mask is fabricated based on the designed circuit pattern. In step 3 (wafer fabrication), a wafer is manufactured by using a material such as silicon. In step 4 (wafer process), called a pre-process, an actual circuit is formed on the wafer by lithography using the prepared mask and wafer. In step 5 (assembly), called a post-process, a semiconductor chip is formed by using the wafer fabricated in step 4, and includes processes such as an assembly process (dicing and bonding) and a packaging process (chip encapsulation). In step 6 (inspection), inspections such as the operation confirmation test and durability test of the semiconductor device fabricated in step 5 are performed. After these steps, the semiconductor device is completed, and shipped (step 7).

Figure 9:
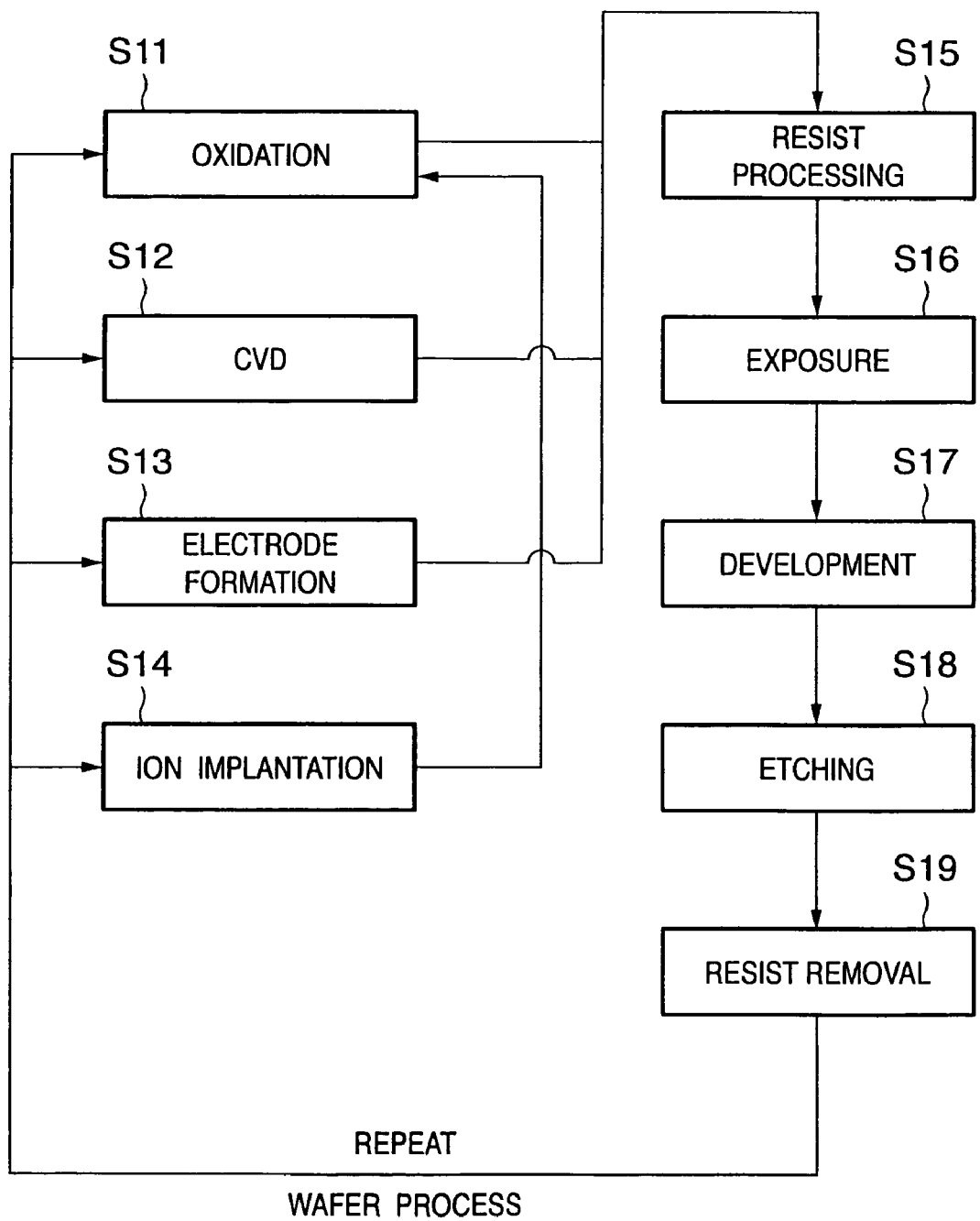
FIG. 9 is a flow chart showing the detailed flow of the wafer process.

FIG. 9 is a flow chart showing the detailed flow of the wafer process. In step 11 (oxidation), the surface of the wafer is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred to the wafer by using the above exposure apparatus. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

According to the present invention, for example, positioning of a stage can be controlled at high accuracy.

As many apparently widely different embodiments of the present invention can be made without departing from the spirit and scope thereof, it is to be understood that the invention is not limited to the specific embodiments thereof except as defined in the claims.

What is claimed is:

1. A moving apparatus comprising:
   a movable stage;
   a first actuator having a plurality of movable elements arranged on said stage and a plurality of stators;
   a plurality of second actuators which drive said plurality of stators;
   a control unit configured to control said plurality of second actuators independently so as to suppress rotation of said plurality of stators, which accompany movement of said plurality of movable elements; and
   an input unit configured to feed forward a target acceleration of said stage or a manipulated variable for said first actuator and to input the target acceleration or the manipulated variable to said control unit.

2. The apparatus according to claim 1, further comprising a measurement unit configured to measure positions of said plurality of stators,
   wherein said plurality of second actuators are controlled based on an output from said measurement unit.

3. An exposure apparatus comprising:
   an optical system which projects exposure light to be irradiated to a master having a pattern onto a substrate;
   a stage which can move while holding the substrate or the master;
   a first actuator having a plurality of movable elements arranged on said stage and a plurality of stators;
   a plurality of second actuators which drive said plurality of stators;
   a control unit configured to control said plurality of second actuators so as to suppress rotation of said plurality of stators, which accompany movement of said plurality of movable elements; and
   an input unit configured to feed forward a target acceleration of said stage or a manipulated variable for said first actuator and to input the target acceleration or the manipulated variable to said control unit.

4. A semiconductor device manufacturing method comprising:
   an applying step of applying a photosensitive material on a substrate;
   an exposure step of transferring a pattern onto the substrate, applied with the photosensitive material in the applying step, by utilizing the exposure apparatus according to claim 3; and
   a developing step of developing the photosensitive material on the substrate where the pattern has been transferred in the exposure step.

* * * * *